United States Patent
Ma et al.

(10) Patent No.: US 12,532,632 B2
(45) Date of Patent: Jan. 20, 2026

(54) DISPLAY PANEL INCLUDING BLACK MATRIX LAYER PROVIDED WITH BLACK MATRIX OPENING HAVING TRANSITIONAL CONNECTION, AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Weitao Ma, Beijing (CN); Lu Yang, Beijing (CN); Chengchung Yang, Beijing (CN); Xiangfei He, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 436 days.

(21) Appl. No.: 17/755,381

(22) PCT Filed: May 12, 2021

(86) PCT No.: PCT/CN2021/093443
§ 371 (c)(1),
(2) Date: Apr. 27, 2022

(87) PCT Pub. No.: WO2021/254044
PCT Pub. Date: Dec. 23, 2021

(65) Prior Publication Data
US 2022/0376213 A1    Nov. 24, 2022

(30) Foreign Application Priority Data
Jun. 17, 2020  (CN) .......................... 202010552325.6

(51) Int. Cl.
*H10K 59/38* (2023.01)
*H10K 59/122* (2023.01)
(Continued)

(52) U.S. Cl.
CPC ........... *H10K 59/38* (2023.02); *H10K 59/351* (2023.02); *H10K 59/8792* (2023.02); *H10K 59/122* (2023.02)

(58) Field of Classification Search
CPC ........................ H10K 50/865; H10K 59/8792
See application file for complete search history.

(56) References Cited

U.S. PATENT DOCUMENTS

| 2005/0121669 A1 | 6/2005 | Kobayashi |
| 2006/0082721 A1 | 4/2006 | Okumoto et al. |

(Continued)

FOREIGN PATENT DOCUMENTS

| CN | 100463581 C | 2/2009 |
| CN | 202433644 U | 9/2012 |

(Continued)

OTHER PUBLICATIONS

European Extended Search Report, mailed Dec. 13, 2022, from EP patent application No. 21825394.6.
(Continued)

*Primary Examiner* — Lex H Malsawma
*Assistant Examiner* — Bruce R. Smith
(74) *Attorney, Agent, or Firm* — Workman Nydegger

(57) ABSTRACT

Provided are a display panel and a display apparatus. The display panel includes: a base substrate; a light-emitting layer, the light-emitting layer is located on one side of the base substrate and has a plurality of light-emitting portions; an encapsulation layer, the encapsulation layer is located on the side of the light-emitting layer that faces away from the base substrate; a black matrix layer, wherein the black (Continued)

matrix layer is located at the side of the encapsulation layer that faces away from the light-emitting layer, and has black matrix openings in areas corresponding to the light-emitting portions, the main body shape of each of the black matrix openings is a polygon, and arc-shaped curves are provided at least at corner positions of the polygon, so as to realize a mutual transition connection between various edges of the polygon; and a color film layer.

17 Claims, 16 Drawing Sheets

(51) Int. Cl.
*H10K 59/35* (2023.01)
*H10K 59/80* (2023.01)

(56) References Cited

U.S. PATENT DOCUMENTS

| | | | |
|---|---|---|---|
| 2007/0285610 | A1 | 12/2007 | Yin et al. |
| 2008/0231778 | A1* | 9/2008 | Tsao ............... G02F 1/133516 349/156 |
| 2014/0285542 | A1 | 9/2014 | Izumi et al. |
| 2017/0271420 | A1* | 9/2017 | Tsai ................ H10K 59/122 |
| 2019/0013363 | A1 | 1/2019 | Joo et al. |
| 2019/0245017 | A1 | 8/2019 | Jeon et al. |
| 2020/0219967 | A1 | 7/2020 | Lou et al. |
| 2020/0227486 | A1 | 7/2020 | Liu et al. |
| 2021/0026471 | A1 | 1/2021 | Yao et al. |
| 2021/0066404 | A1 | 3/2021 | Huang |
| 2021/0159286 | A1 | 5/2021 | Ma et al. |
| 2021/0200365 | A1* | 7/2021 | Lee ..................... H10K 59/40 |
| 2021/0351243 | A1 | 11/2021 | Chang et al. |

FOREIGN PATENT DOCUMENTS

| | | | | |
|---|---|---|---|---|
| CN | 104698673 | A | * 6/2015 | ........... G02F 1/1335 |
| CN | 108878474 | A | 11/2018 | |
| CN | 109119453 | A | 1/2019 | |
| CN | 109188757 | A | 1/2019 | |
| CN | 109216415 | A | 1/2019 | |
| CN | 109270757 | A | 1/2019 | |
| CN | 109713018 | A | 5/2019 | |
| CN | 110289298 | A | 9/2019 | |
| CN | 110389685 | A | 10/2019 | |
| CN | 110518052 | A | 11/2019 | |
| CN | 110534551 | A | 12/2019 | |
| CN | 110767672 | A | 2/2020 | |
| CN | 110867476 | A | 3/2020 | |
| CN | 111162109 | A | 5/2020 | |
| EP | 3425691 | A1 | 1/2019 | |
| JP | 2014186257 | A | 10/2014 | |
| JP | 201681531 | A | 5/2016 | |
| KR | 20190033118 | A | 3/2019 | |
| WO | 2019087468 | A1 | 5/2019 | |

OTHER PUBLICATIONS

Chinese Office Action, mailed Apr. 19, 2022, from Chinese Application No. 202010552325.6.
Chinese Office Action, mailed Oct. 28, 2022, from Chinese Application No. 202010552325.6.
Japanese Office Action, mailed Jan. 30, 2025, from Japanese patent application No. 2022-527724, 12 pages.
Japanese Notice of Allowance, mailed Oct. 21, 2025, from Japan Patent Application No. 2022-527724, 8 pages.

* cited by examiner

DISPLAY PANEL INCLUDING BLACK MATRIX LAYER PROVIDED WITH BLACK MATRIX OPENING HAVING TRANSITIONAL CONNECTION, AND DISPLAY APPARATUS

CROSS REFERENCE TO RELATED APPLICATION

The present application is a US National Stage of International Application No. PCT/CN2021/093443, filed on May 12, 2021, which claims the priority of Chinese Patent Application No. 202010552325.6, filed to the Chinese Patent Office on Jun. 17, 2020 and entitled "display panel and display apparatus", which is incorporated in its entirety herein by reference.

FIELD

The present disclosure relates to the field of displays, and in particular to a display panel and a display apparatus.

BACKGROUND

With the multimedia developing, the display apparatuses are increasingly significant. In response to this, a variety of display apparatuses such as liquid crystal displays and organic light emitting displays have been put into use.

Among various display apparatuses, the organic light emitting displays utilize the organic light emitting devices that generate light upon the recombination of electrons and holes, to display the images. The organic light emitting displays feature the short response time, high brightness, large visual angle, low power consumption, etc.

SUMMARY

The present disclosure provides a display panel, including: a base substrate; a light emitting layer, arranged at one side of the base substrate and provided with a plurality of light emitting portions; an encapsulation layer, arranged at one side, away from the base substrate, of the light emitting layer; a black matrix layer, arranged at one side, away from the light emitting layer, of the encapsulation layer and provided with a plurality of black matrix openings in regions corresponding to the plurality of light emitting portions, where body shapes of the black matrix openings are polygons and have cambered curves at least at corners of the polygons, to realize transitional connections among various edges of the polygons; and a color filter layer, arranged at one side, away from the encapsulation layer, of the black matrix layer and provided with a plurality of color resist portions in regions corresponding to the black matrix openings.

In a possible implementation, the corners of the black matrix openings are circular arcs protruding towards one sides away from centers of the black matrix openings.

In a possible implementation, the corners of the black matrix openings are the circular arcs with corner points as circle centers, and the corner points are intersection points between extension lines of adjacent edges.

In a possible implementation, the corners of the black matrix openings are circular arcs dented towards one sides close to centers of the black matrix openings.

In a possible implementation, the corners of the black matrix openings are the circular arcs with corner points as circle centers, and the corner points are intersection points between extension lines of adjacent edges.

In a possible implementation, the body shapes of the black matrix openings are quadrilaterals, pentagons or hexagons; and radii of the circular arcs are one fifth to three fifths of lengths of the shortest edges of the black matrix openings.

In a possible implementation, portions, except for the corners, of the edges of the black matrix openings are linear.

In a possible implementation, portions, except for the corners, of the edges of the black matrix openings are arc segments protruding towards one sides away from the centers of the black matrix openings.

In a possible implementation, portions, except for the corners, of the edges of the black matrix openings are arc segments dented towards the one sides close to the centers of the black matrix openings.

In a possible implementation, the circular arcs at the corners are directly connected to the arc segments of the edges.

In a possible implementation, orthographic projections, on the base substrate, of the black matrix openings cover orthographic projections, on the base substrate, of the light emitting portions.

In a possible implementation, shapes of the light emitting portions are similar with the body shapes of the black matrix openings.

In a possible implementation, the centers of the black matrix openings overlap centers of the light emitting portions.

In a possible implementation, a pixel definition layer is arranged between the base substrate and the light emitting layer, the pixel definition layer is provided with a plurality of pixel definition openings, the light emitting portions are arranged in the pixel definition openings, and the shapes of the light emitting portions are consistent with shapes of the pixel definition openings.

In a possible implementation, the shapes of the light emitting portions are expanded outwards by 2 micrometers-6 micrometers, to obtain the body shapes of the black matrix openings.

In a possible implementation, a portion, except for the black matrix openings, of the black matrix layer is a black matrix body, and orthographic projections, on the base substrate, of the color resist portions cover a part of the black matrix body on peripheries of the black matrix openings.

In a possible implementation, a touch layer is arranged between the encapsulation layer and the black matrix layer; the touch layer includes a first insulation layer, a first metal layer, a second insulation layer, a second metal layer, and a third insulation layer which are arranged at one side of the encapsulation layer in sequence; the second metal layer includes a plurality of first touch electrodes extending in a first direction and a plurality of second touch electrodes extending in a second direction, the first touch electrodes and the second touch electrodes are insulated alternately, each of the first touch electrodes includes a plurality of first touch sub-electrode blocks which are connected to one another, and each of the second touch electrodes includes a plurality of second touch sub-electrode blocks which are spaced from one another; and the first metal layer includes a plurality of bridging electrodes, and the second touch sub-electrode blocks in the same second direction being electrically connected through the bridging electrodes.

In a possible implementation, the first touch sub-electrode blocks, the second touch sub-electrode blocks, and the bridging electrodes are provided with meshes, orthographic projections, on the base substrate, of the meshes cover the orthographic projections, on the base substrate, of the light emitting portions.

In a possible implementation, an orthographic projection, on the base substrate, of the region, except for the black matrix openings, of the black matrix layer covers a region, except for the meshes, of the first touch sub-electrode blocks, a regions except for the meshes, of the second touch sub-electrode blocks, and a region, except for the meshes, of the bridging electrodes.

In a possible implementation, one side, away from the black matrix layer, of the color filter layer is provided with a protective layer.

In a possible implementation, one side, away from the color filter layer, of the protective layer is provided with a cover plate or a covering filter layer.

An embodiment of the present disclosure further provides a display panel, including: a base substrate; a pixel definition layer, arranged at one side of the base substrate and provided with a plurality of pixel definition openings; a light emitting layer, arranged at one side, away from the base substrate, of the pixel definition layer and provided with a plurality of light emitting portions, and the light emitting portions are arranged in the pixel definition openings; an encapsulation layer, arranged at one side, away from the pixel definition layer, of the light emitting layer; a black matrix layer, arranged at one side, away from the light emitting layer, of the encapsulation layer and provided with black matrix openings in regions corresponding to the light emitting portions, where shapes of the black matrix openings are circles or ellipses, and orthographic projections, on the base substrate, of the black matrix openings cover orthographic projections, on the base substrate, of the pixel definition openings; and a color filter layer, arranged at one side, away from the encapsulation layer, of the black matrix layer and provided with color resist portions in regions corresponding to the black matrix openings.

In a possible implementation, centers of the black matrix openings overlap centers of the light emitting portions.

An embodiment of the present disclosure further provides a display apparatus, including: the display panel provided in the embodiments of the present disclosure; or the display panel further provided in the embodiments of the present disclosure.

DETAILED DESCRIPTION OF THE EMBODIMENTS

To make the objectives, technical solutions, and advantages in the embodiments of the present disclosure more clear, the technical solutions in the embodiments of the present disclosure will be clearly and completely described below in combination with the accompanying drawings in the embodiments of the present disclosure. It is obvious that the described embodiments are some, rather than all, embodiments of the present disclosure, not all of them. Based on the described embodiments of the present disclosure, all other embodiments obtained by a person of ordinary skill in the art without making inventive efforts fall within the scope of protection of the present disclosure.

Unless defined otherwise, technical or scientific terms used in the present disclosure should be of ordinary meaning as understood by a person of ordinary skill in the art to which the present disclosure pertains. The words "first", "second", etc. used in the present disclosure do not denote any order, quantity, or importance, but are merely used for distinguishing between different components. The words "comprising", "including", etc. are intended to mean that an element or item in front of the word encompasses elements or items that present behind the word and equivalents thereof, but does not exclude other elements or items. The words "connection", "connected", etc. are not limited to the physical or mechanical connection, but may include the electrical connection, regardless of being direct or indirect. "Upper", "lower", "left", "right", etc. are merely used to indicate relative positional relations, which may also change accordingly when the absolute position of the described object changes.

To keep the following description of the embodiments of the present disclosure clear and concise, the detailed descriptions of known functions and components are omitted from the present disclosure.

Figure 1A:
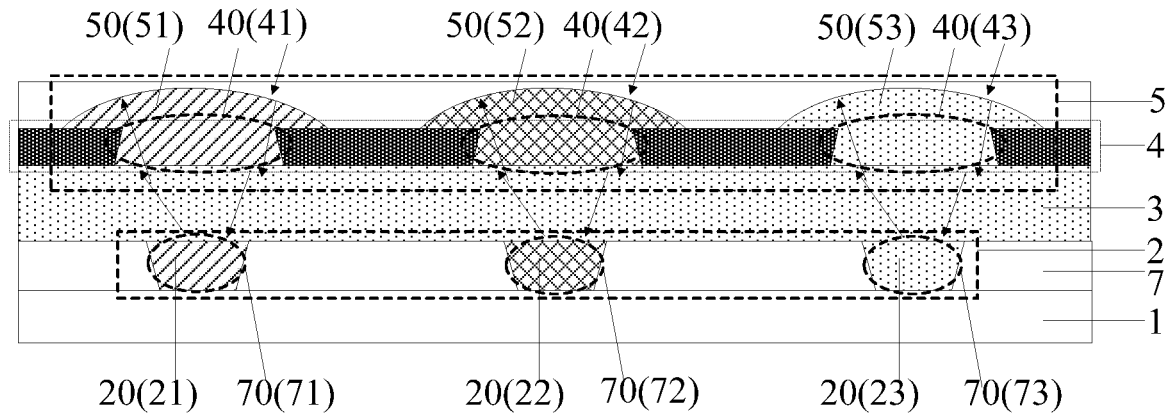
FIG. 1A is a sectional structural schematic diagram of a display panel provided in an embodiment of the present disclosure.
Figure 1B:
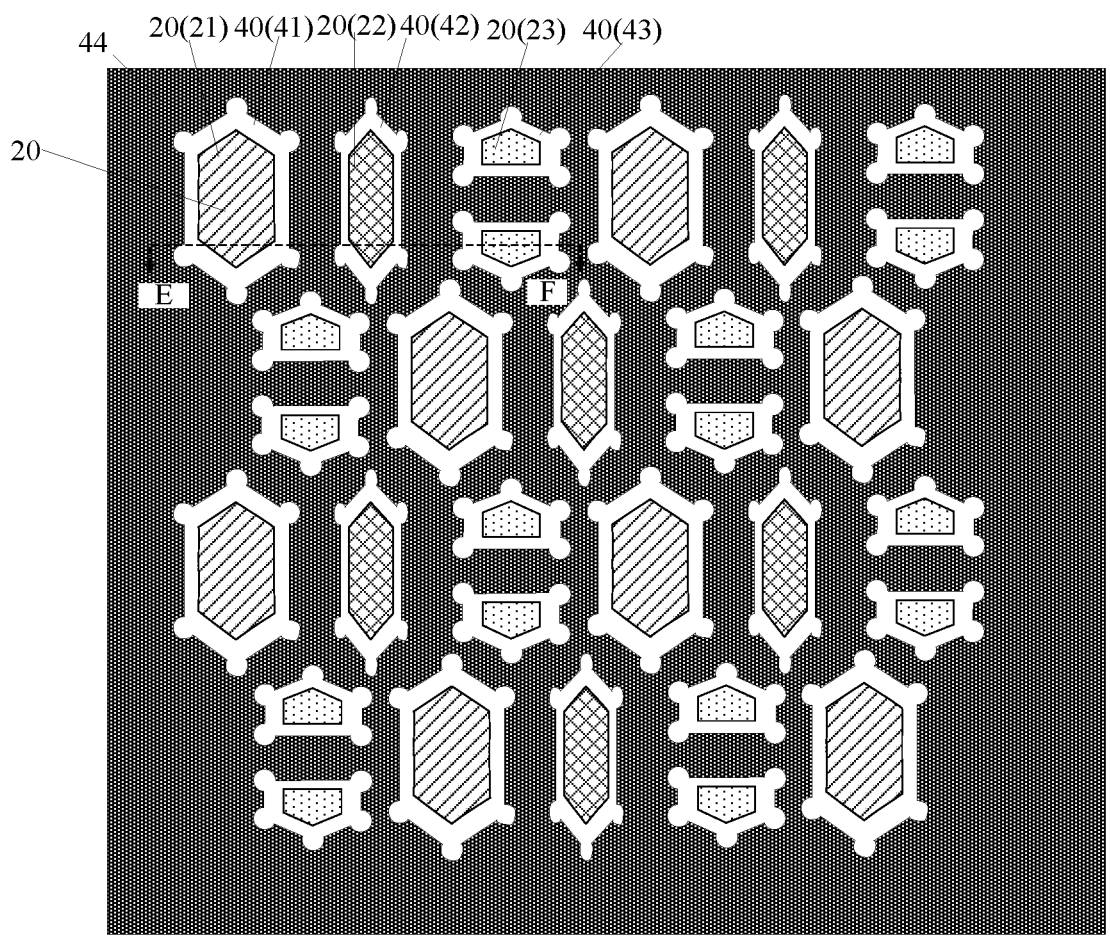
FIG. 1B is a top-view structural schematic diagram of a display panel provided in an embodiment of the present disclosure.
Figure 2A:
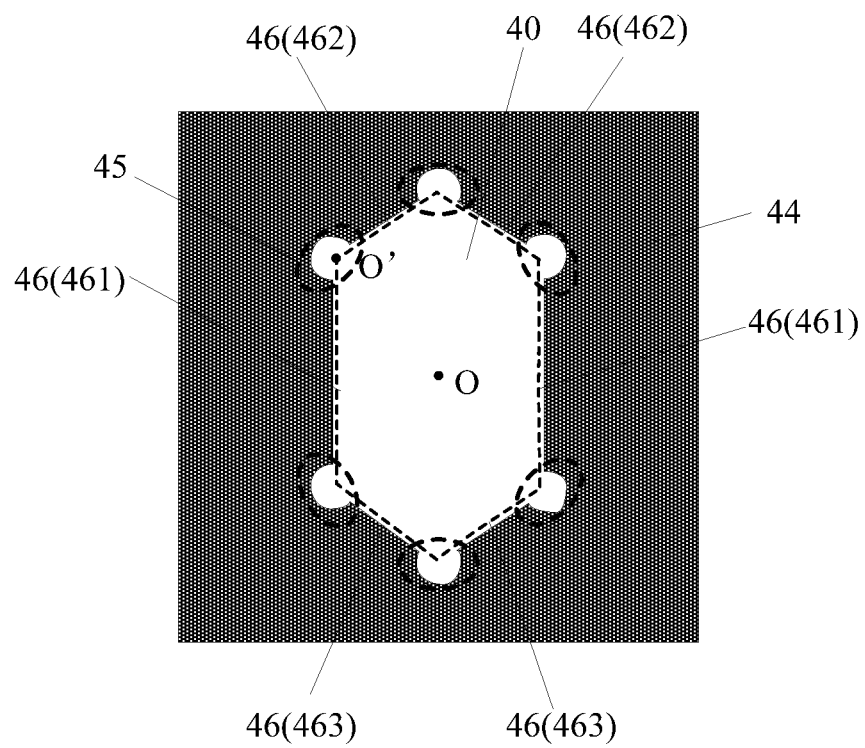
FIG. 2A is a structural schematic diagram of a hexagonal black matrix opening with corners protruding outwards provided in an embodiment of the present disclosure.

As shown in FIGS. 1A, 1B, and 2A, FIG. 1A is a sectional schematic diagram of FIG. 1B at a dotted line EF, and FIG. 2A is an enlarged schematic diagram of a black matrix opening in FIG. 1B. An embodiment of the present disclosure provides a display panel, including a base substrate 1, a light emitting layer 2, an encapsulation layer 3, a black matrix layer 4 and a color filter layer 5.

The base substrate 1 may be a glass substrate, a silicon substrate, or a flexible substrate. The base substrate 1 may be formed of, for example, a plastic material with excellent heat resistance and durability, such as polyimide (PI), polycarbonate (PC), polyethylene terephthalate (PET), polycarbonate, polyethylene, polyacrylate, polycarbonate, polyarylate, polyetherimide, polyethersulfone, polyethylene glycol terephthalate, polyethylene (PE), polypropylene (PP), polysulfone (PSF), polymethylmethacrylate (PMMA), cellulose triacetate (TAC), cyclic olefin polymer (COP), cyclic olefin copolymer (COC), etc.

The light emitting layer 2 is arranged at one side of the base substrate 1 and provided with a plurality of light emitting portions 20. Specifically, the light emitting portions 20 may include one or more first-type light emitting portions 21, one or more second-type light emitting portions 22, and one or more third-type light emitting portions 23. Specifically, the first-type light emitting portions 21 may be light emitting portions emitting blue light and made of organic light emitting materials emitting blue light; the second-type light emitting portions 22 may be light emitting portions emitting red light and made of organic light emitting materials emitting red light; and the third-type light emitting portions 23 may be light emitting portions emitting green light and made of organic light emitting materials emitting green light.

The encapsulation layer 3 is arranged at one side, away from the base substrate 1, of the light emitting layer 2; and the encapsulation layer 3 may be a thin film encapsulation layer and may include a first inorganic encapsulation layer, an organic encapsulation layer, and a second inorganic encapsulation layer which are laminated in sequence.

The black matrix layer 4 is arranged at one side, away from the light emitting layer 2, of the encapsulation layer 3 and provided with black matrix openings 40 in regions corresponding to the light emitting portions 20. A body shape of the black matrix opening 40 (as shown by a dotted hexagonal frame in FIG. 2A) is a polygon and has cambered curves at least at corners 45 of the polygon, to realize transitional connections between various edges 46 of the polygon. Specifically, a portion, except for the black matrix openings 40, of the black matrix layer 4 is a black matrix body, that is, a region except for the black matrix openings 40 may be the black matrix body 44. It may be understood that a body shape of a black matrix opening 40 may be specifically interpreted as a main outline of the black matrix opening 40, and specific edges 46 may be non-linear line segments, but an overall shape of the back matrix opening 40 is still a polygon. For example, a body shape of the black matrix opening 40 may be a rectangle, but four edges of the rectangle may be cambered. In some embodiments, each of the edges of the black matrix opening 40 may also be linear. The black matrix openings 40 correspond to the light emitting portions 20, which may be understood that orthographic projections, on the base substrate 1, of the black matrix openings 40 cover orthographic projections, on the base substrate 1, of the light emitting portions 20, and the black matrix layer 4 is correspondingly provided with an opening at a position of each of the light emitting portions 20, to form the black matrix openings 40 corresponding one-to-one to the light emitting portions 20, so that the light emitted by the light emitting portions 20 is emitted through the black matrix openings 40. As shown in FIGS. 1A and 1B, the black matrix openings 40 may include first-type black matrix openings 41 corresponding to the first-type light emitting portions 21, second-type black matrix openings 42 corresponding to the second-type light emitting portions 22, and third-type black matrix openings 43 corresponding to the third-type light emitting portions 23. Body shapes of the first-type black matrix openings 41 may be consistent with shapes of the first-type light emitting portions 21, and may be, for example, all hexagons; body shapes of the second-type black matrix openings 42 may be consistent with shapes of the second-type light emitting portions 22; and body shapes of the third-type black matrix openings 43 may be consistent with shapes of the third-type light emitting portions 23.

The color filter layer 5 is arranged at one side, away from the encapsulation layer 3, of the black matrix layer 4 and provided with color resist portions 50 in regions corresponding to the black matrix openings 40. Specifically, since the color resist portions 50 are arranged at positions corresponding to the black matrix openings 40 of the black matrix layer 4, and the black matrix openings 40 correspond to the light emitting portions 20, positions of the color resist portions 50 also correspond to positions of the light emitting portions 20. Specifically, the color resist portions 50 may include first-type color resist portions 51 corresponding to the first-type light emitting portions 21, second-type color resist portions 52 corresponding to the second-type light emitting portions 22, and third-type color resist portions 53 corresponding to the third-type light emitting portions 23. When the first-type light emitting portions 21 are the light emitting portions emitting the blue light, the first-type color resist portions 51 may be blue color resist portions that transmit the blue light and block transmission of other light colors; when the second-type light emitting portions 22 are the light emitting portions that emit the red light, the second-type color resist portions 52 may be red color resist portions that transmit the red light and block transmission of other light colors; and when the third-type light emitting portions 23 are the light emitting portions that emit the green light, the third-type color resist portions 53 may be green color resist portions that transmit the green light and block transmission of other light colors.

In embodiments of the present disclosure, the body shapes of the black matrix openings 40 are the polygons, and the black matrix openings 40 are the cambered curves at least at the corners 45 of the polygons, to realize cambered transitional connections among the edges 46 of the polygons. Compared with a conventional display panel in which black matrix openings close up sharply at corners, the cambered corners in the embodiments of the present disclosure are provided, thereby smoothing size mutations at sharp corners and weakening a diffraction effect of reflected light generated after external ambient light passes through the display panel, to weaken a color separation phenomenon.

It may be understood that the display panel in the embodiments of the present disclosure may include no circular polarizer. Through the color filter layer 5 and the black matrix layer 4 as provided in the embodiments of the present disclosure, at a position where display is required, that is, the positions of the light emitting portions 20, the light emitted from the light emitting portions 20 is emitted through the black matrix openings 40, without affecting the display. The black matrix body 44 may block a position except for the light emitting portions 20, so that the external ambient light fails to enter, and the circular polarizer may prevent the external light from being reflected.

It should be noted that color separation refers to a phenomenon that reflected light shows color (red, green, and blue) separation under irradiation of ambient light (for example, a point light source and a line light source) in a screen rest state. For the display panel with the color filter layer and the black matrix layer instead of the circular polarizer, as shown in FIG. 1A, under the ambient light, light rays pass through the color filter layer 5 and become monochromatic light, the monochromatic light enters a metal film layer (for example, an anode layer and/or a cathode layer, not shown in FIG. 1A) at a bottom of the display panel and is reflected by the metal film layer, and the monochromatic reflected light passes through the black matrix openings 40 and is emitted out. Since the small black matrix openings 40 (for example, when the black matrix openings are in the order of $\lambda*10^2$, where $\lambda$ is a wavelength of the reflected light), when the black matrix openings 40 are rectangular or hexagonal with the sharp corners, it is inevitable for a screen to generate the diffraction effect of the monochromatic (R, G, B) light under the ambient light (specifically, the point light source). These diffraction effects further increase the color separation.

During specific implementation, as shown in FIG. 1A, a pixel definition layer 7 is arranged between the base substrate 1 and the light emitting layer 2. The pixel definition layer 7 is provided with a plurality of pixel definition openings 70, the light emitting portions 20 are arranged in the pixel definition openings 70, and shapes of the light emitting portions 20 are consistent with shapes of the pixel definition openings 70. It may be understood that in a process for manufacturing the display panel, the pixel definition layer 7 with the pixel definition openings 70 is formed first, and then the light emitting portions 20 are formed in the pixel definition openings 70, so that the shapes of the light emitting portions 20 are consistent with the shapes of the pixel definition openings 70. It may be understood that specifically, the light emitting portions 20 may be positions occupied by light emitting regions of the display panel during display, that is, during specific implementation, for each sub-pixel, a light emitting material formed at a position of the pixel definition opening may be larger than a region occupied by the pixel definition opening. However, the light emitting regions depend on an area of a light emitting material at a power-on position, that is, the light emitting portions 20 depend on a size of regions, making contact with anodes, of the light emitting materials.

Figure 2B:
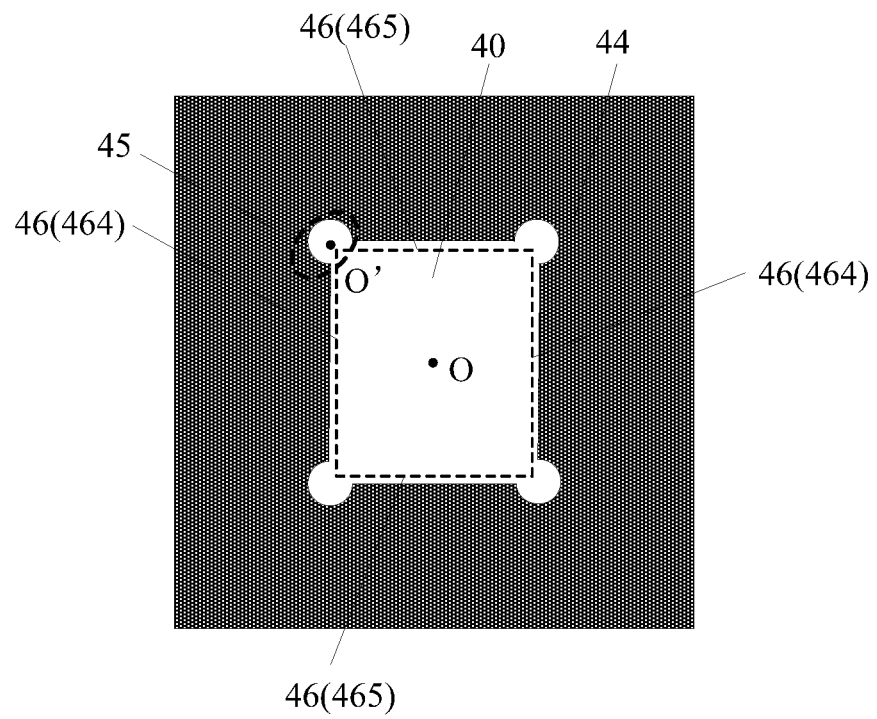
FIG. 2B is a structural schematic diagram of a quadrilateral black matrix opening with corners protruding outwards provided in an embodiment of the present disclosure.
Figure 2C:
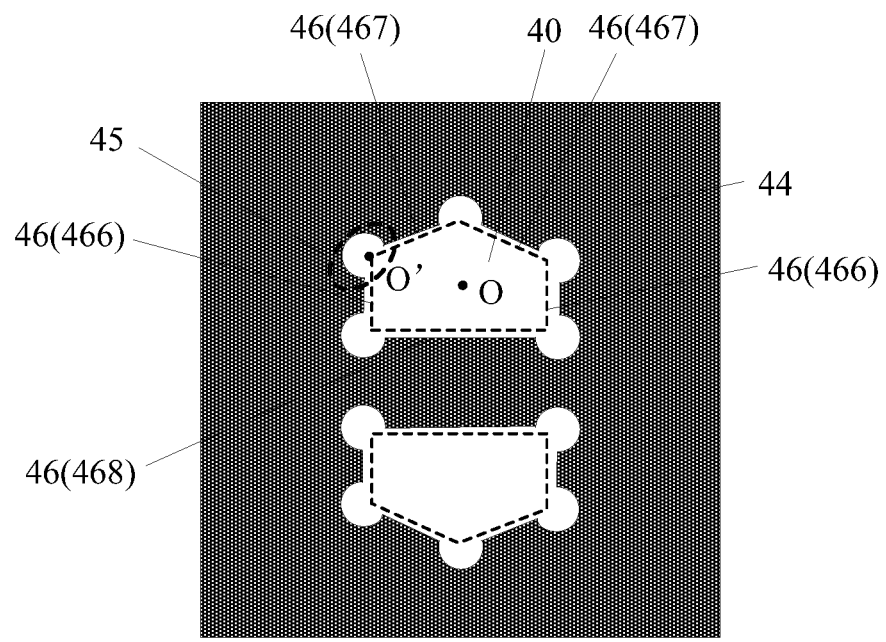
FIG. 2C is a structural schematic diagram of a pentagonal black matrix opening with corners protruding outwards provided in an embodiment of the present disclosure.

During specific implementation, as shown in FIGS. 2A-2C, a black matrix opening 40 has circular arcs at the corners 45 protruding towards one sides away from a center O of the black matrix opening 40. Specifically, the black matrix opening 40 has the circular arcs, where the circular arcs are arranged at the corners 45, and protruding towards one sides away from the center O of the black matrix opening 40 by taking corner points O' as circle centers, and the corner points O' are intersection points between extension lines of adjacent edges 46.

For example, as shown in FIG. 2A, a body shape of a black matrix opening 40 is a hexagon with six edges 46, every two adjacent edges 46 of the six edges 46 intersect each other to form six corners 45, each of the corners 45 has a corner point O', and non-closed circular arcs (that is, circular arcs protruding outwards) may be arranged at the corners 45, where the non-closed circular arcs take the corner points O' as circle centers and protrude towards one sides away from the center O of the black matrix opening 40, to realize cambered transitions between adjacent edges 46 at the corners 45.

Alternatively, as shown in FIG. 2B, a body shape of a black matrix opening 40 is a quadrilateral with four edges 46, every two adjacent edges 46 of the four edges intersect each other to form four corners 45, each of the corners 45 has a corner point O', and non-closed circular arcs (that is, circular arcs protruding outwards) may be arranged at the corners 45, where the non-closed circular arcs take the corner points O' as circle centers and protrude towards one sides away from the center O of the black matrix opening 40, to realize cambered transitions between adjacent edges 46 at the corners 45.

Alternatively, as shown in FIG. 2C, a body shape of a black matrix opening 40 is a pentagon with five edges 46, every two adjacent edges 46 of the five edges intersect each other to form five corners 45, each of the corners 45 has a corner point O', and non-closed circular arcs (that is, circular arcs protruding outwards) may be arranged at the corners 45, where the non-closed circular arcs take the corner points O' as circle centers and protrude towards one sides away from the center O of the black matrix opening 40, to realize cambered transitions between adjacent edges 46 at the corners 45.

During specific implementation, a black matrix opening 40 has circular arcs at the corners 45 dented towards one sides close to a center O of the black matrix opening 40. Specifically, the black matrix opening 40 has the circular arcs, where the circular arcs are arranged at the corners 45, and are dented towards one sides close to the center O of the black matrix opening 40 by taking the corner points O' as circle centers, and the corner points O' are intersection points between extension lines of adjacent edges 46.

Figure 3A:
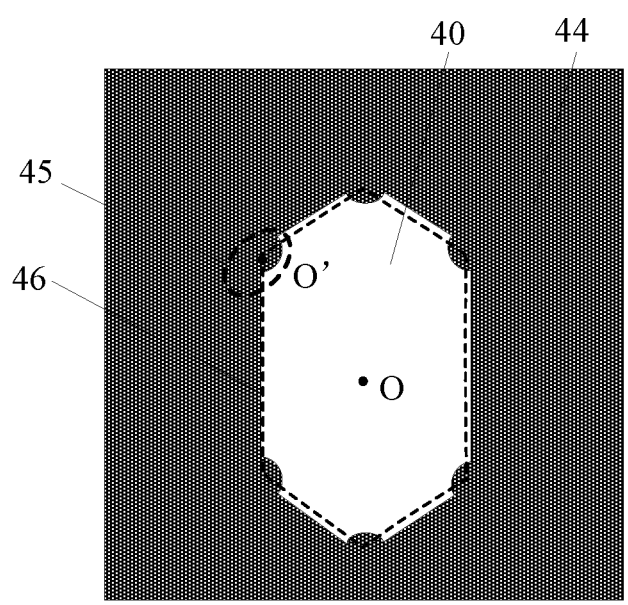
FIG. 3A is a structural schematic diagram of a hexagonal black matrix opening with corners dented inwards provided in an embodiment of the present disclosure.

For example, as shown in FIG. 3A, a body shape of a black matrix opening 40 is a hexagon with six edges 46, every two adjacent edges 46 of the six edges 46 intersect each other to form six corners 45, each of the corners 45 has a corner point O', and non-closed circular arcs (that is, circular arcs dented inwards) may be arranged at the corners 45, where the non-closed circular arcs take the corner points O' as circle centers and are dented towards one sides close to the center O of the black matrix opening 40, to realize cambered transitions between adjacent edges 46 at the corners 45.

Figure 3B:
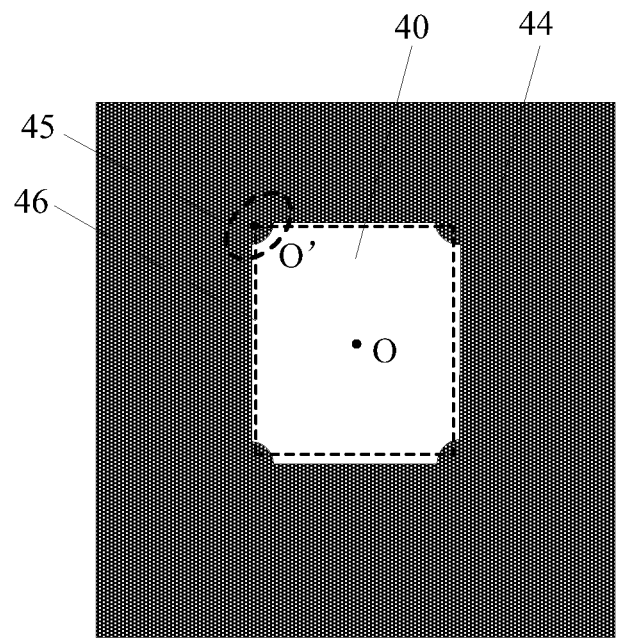
FIG. 3B is a structural schematic diagram of a quadrilateral black matrix opening with corners dented inwards provided in an embodiment of the present disclosure.

Alternatively, as shown in FIG. 3B, a body shape of a black matrix opening 40 is a quadrilateral with four edges 46, every two adjacent edges 46 of the four edges intersect each other to form four corners 45, each of the corners 45 has a corner point O', and non-closed circular arcs (that is, circular arcs dented inwards) may be arranged at the corners 45, where the non-closed circular arcs take the corner points O' as circle centers and are dented towards one sides close to the center O of the black matrix opening 40, to realize cambered transitions between adjacent edges 46 at the corners 45.

Figure 3C:
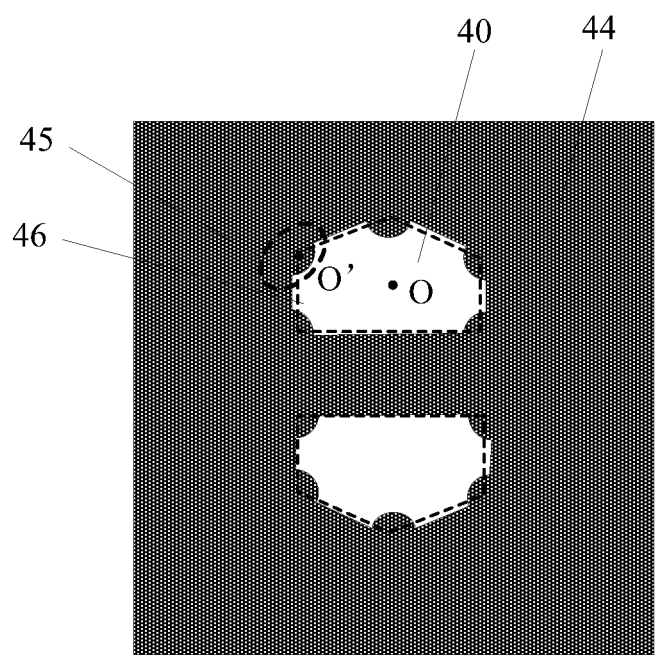
FIG. 3C is a structural schematic diagram of a pentagonal black matrix opening with corners dented inwards provided in an embodiment of the present disclosure.

Alternatively, as shown in FIG. 3C, a body shape of a black matrix opening 40 is a pentagon with five edges 46, every two adjacent edges 46 of the five edges intersect each other to form five corners 45, each of the corners 45 has a corner point O', and non-closed circular arcs (that is, circular arcs dented inwards) may be arranged at the corners 45, where the non-closed circular arcs take the corner points O' as circle centers and are dented towards one sides close to the center O of the black matrix opening 40, to realize cambered transitions between adjacent edges 46 at the corners 45.

During specific implementation, a body shape of a black matrix opening 40 is a quadrilateral, a pentagon, or a hexagon; and a radius of a circular arc is one fifth to one half of a length of the smallest edge 46 of the black matrix opening 40.

In some embodiments, as shown in FIG. 2A, a body shape of a black matrix opening 40 is the hexagon, and the hexagon has two first-type edges 461 arranged opposite and parallel to each other, second-type edges 462 connected to first ends of the two first-type edges 461 respectively, and third-type edges 463 connected to second ends of the two first-type edges 461 respectively. Extension lengths of the first-type edges 461 are greater than extension lengths of the second-type edges 462 and extension lengths of the third-type edges 463, and the extension lengths of the second-type edges 462 are the same as the extension lengths of the third-type edges 463. Therefore, in the hexagon, radii of the circular arcs at the corners 45 may be one fifth to one half of lengths of the second-type edges 462.

In some embodiments, as shown in FIG. 2B, a body shape of a black matrix opening 40 is the quadrilateral, and the quadrilateral has two fourth-type edges 464 arranged opposite and parallel to each other, and fifth-type edges 465 connecting corresponding ends of the two fourth-type edges 464 respectively. Extension lengths of the fourth-type edges 464 are greater than extension lengths of the fifth-type edges 465. Therefore, in the quadrilateral, radii of the circular arcs at the corners 45 may be one fifth to one half of lengths of the fifth-type edges 465.

In some embodiments, as shown in FIG. 2C, a body shape of a black matrix opening 40 is the pentagon, and the pentagon has two sixth-type edges 466 arranged opposite and parallel to each other, seventh-type edges 467 connected to first ends of the two sixth-type edges 466 respectively, and an eighth-type edge 468 connecting two second ends of the two sixth-type edges 466, respectively. Extension lengths of the sixth-type edges 466 are smaller than extension lengths of the seventh-type edges 467, and lengths of the seventh-type edges 467 are smaller than a length of the eighth-type edge 468. Therefore, in the pentagon, radii of the circular arcs at the corners 45 may be one fifth to one half of lengths of the sixth-type edges 466. In the embodiments of the present disclosure, the radii of the circular arcs are one fifth to three fifths of lengths of the shortest edges of the black matrix openings.

During specific implementation, portions, except for the corners 45, of the edges 46 of the black matrix openings 40 are linear. For example, as shown in FIG. 2A, the body shape of the black matrix opening 40 is the hexagon with circular arcs protruding outwards at the corners 45 and the linear edges 46; as shown in FIG. 3A, the body shape of the black matrix opening 40 is the hexagon with circular arcs dented inwards at the corners 45 and the linear edges 46; as shown in FIG. 2B, the body shape of the black matrix opening 40 is the quadrilateral with circular arcs protruding outwards at the corners 45 and the linear edges 46; as shown in FIG. 3B, the body shape of the black matrix opening 40 is the quadrilateral with circular arcs dented inwards at the corners 45 and the linear edges 46; as shown in FIG. 2C, the body shape of the black matrix opening 40 is the pentagon with circular arcs protruding outwards at the corners 45 and the linear edges 46; and as shown in FIG. 3C, the body shape of the black matrix opening 40 is the pentagon with circular arcs dented inwards at the corners 45 and the linear edges 46.

Figure 4A:
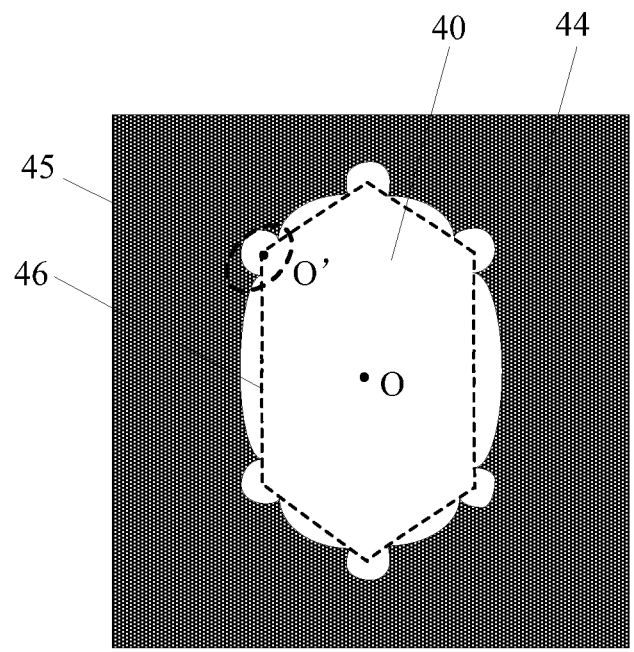
FIG. 4A is a structural schematic diagram of a hexagonal black matrix opening with corners protruding outwards and edges protruding outwards provided in an embodiment of the present disclosure.
Figure 4B:
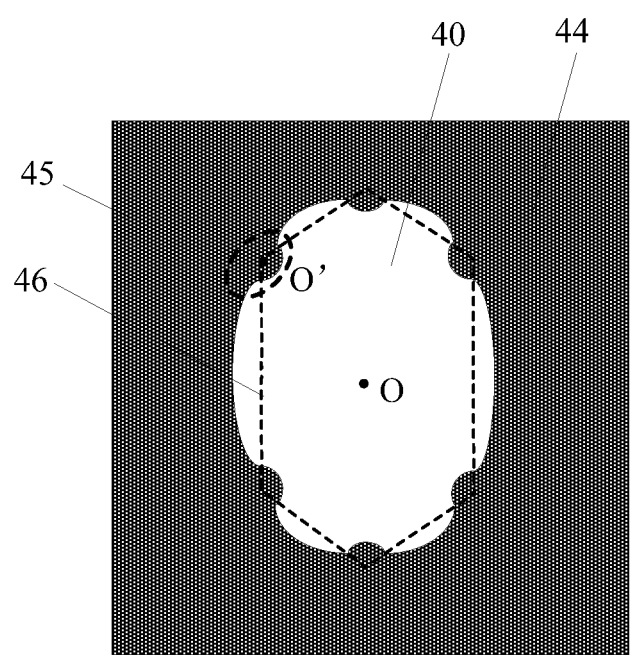
FIG. 4B is a structural schematic diagram of a hexagonal black matrix opening with corners dented inwards and edges protruding outwards provided in an embodiment of the present disclosure.
Figure 5A:
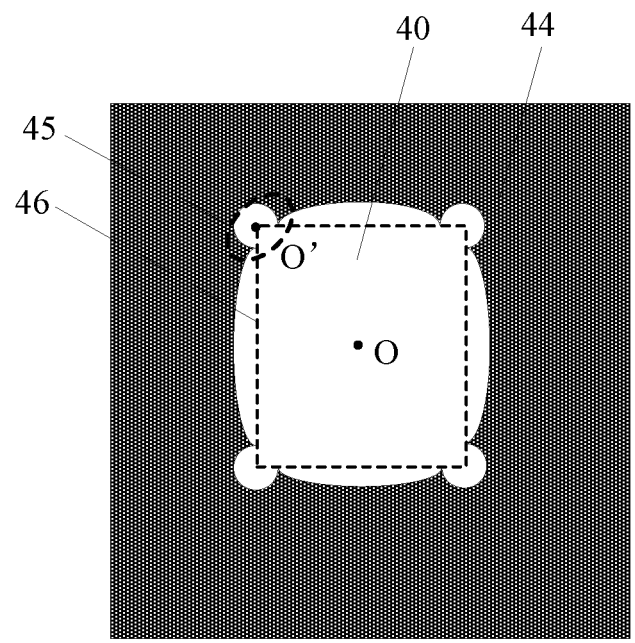
FIG. 5A is a structural schematic diagram of a quadrilateral black matrix opening with corners protruding outwards and edges protruding outwards provided in an embodiment of the present disclosure.
Figure 5B:
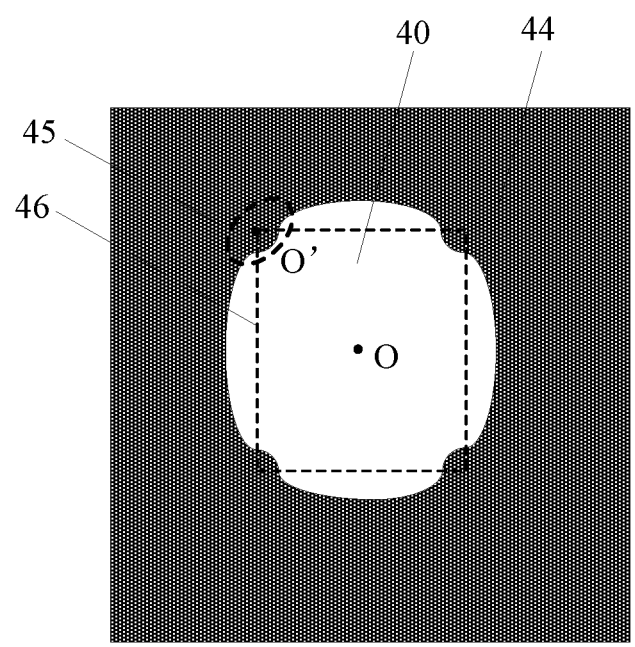
FIG. 5B is a structural schematic diagram of a quadrilateral black matrix opening with corners dented inwards and edges protruding outwards provided in an embodiment of the present disclosure.
Figure 6A:
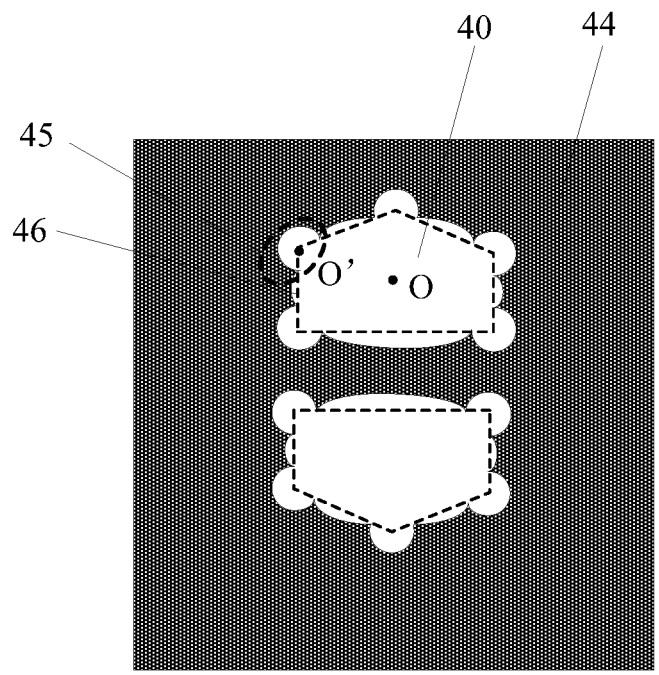
FIG. 6A is a structural schematic diagram of a pentagonal black matrix opening with corners protruding outwards and edges protruding outwards provided in an embodiment of the present disclosure.
Figure 6B:
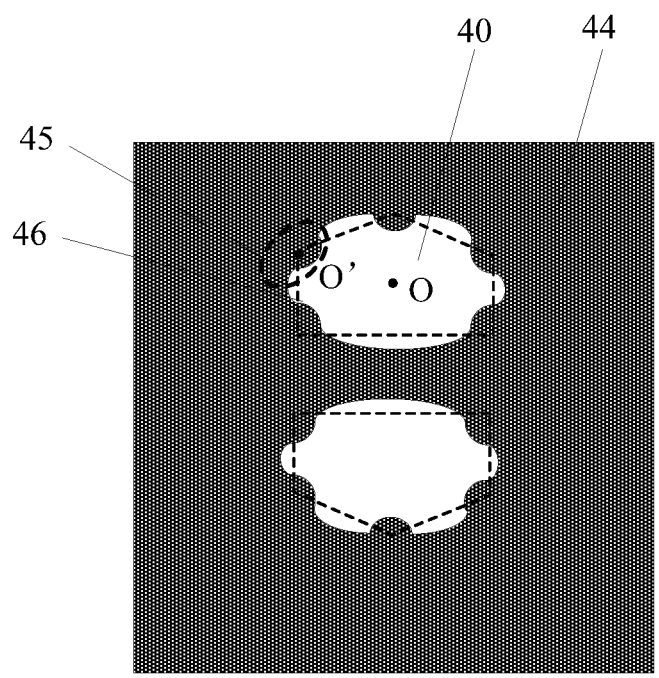
FIG. 6B is a structural schematic diagram of a pentagonal black matrix opening with corners dented inwards and edges protruding outwards provided in an embodiment of the present disclosure.

During specific implementation, portions, except for the corners 45, of the edges 46 of the black matrix openings 40 are arc segments protruding towards one sides away from the centers O of the black matrix openings 40, that is, the edges 46 are arc segments protruding outwards. For example, as shown in FIG. 4A, a body shape of a black matrix opening 40 is the hexagon with circular arcs protruding outwards at corners 45 and arc segments protruding outwards as edges 46; and as shown in FIG. 4B, a body shape of a black matrix opening 40 is the hexagon with circular arcs dented inwards at corners 45 and arc segments protruding outwards as edges 46. For example, as shown in FIG. 5A, a body shape of a black matrix opening 40 is the quadrilateral with circular arcs protruding outwards at corners 45 and arc segments protruding outwards as edges 46; and as shown in FIG. 5B, a body shape of a black matrix opening 40 is the quadrilateral with circular arcs dented inwards at corners 45 and arc segments protruding outwards as edges 46. For example, as shown in FIG. 6A, a body shape of a black matrix openings 40 is the pentagon with circular arcs protruding outwards at corners 45 and arc segments protruding outwards as edges 46; and as shown in FIG. 6B, a body shape of a black matrix opening 40 is the pentagon with circular arcs dented inwards at corners 45 and arc segments protruding outwards as edges 46.

Figure 7A:
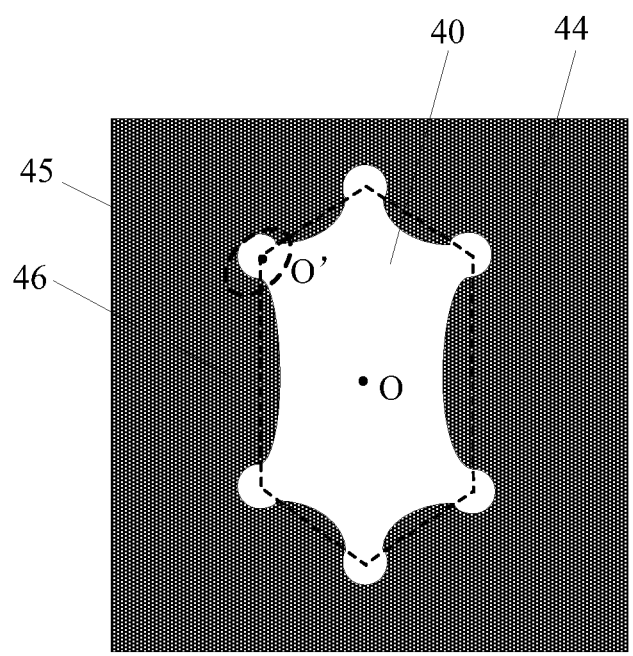
FIG. 7A is a structural schematic diagram of a hexagonal black matrix opening with corners protruding outwards and edges dented inwards provided in an embodiment of the present disclosure.
Figure 7B:
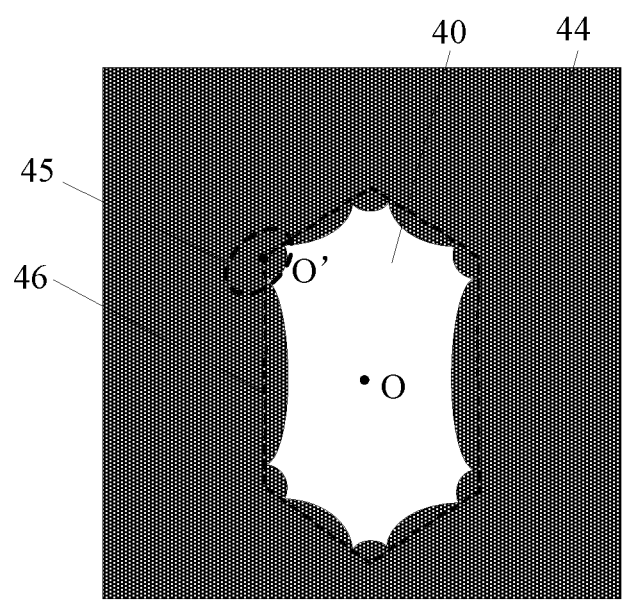
FIG. 7B is a structural schematic diagram of a hexagonal black matrix opening with corners dented inwards and edges dented inwards provided in an embodiment of the present disclosure.
Figure 8A:
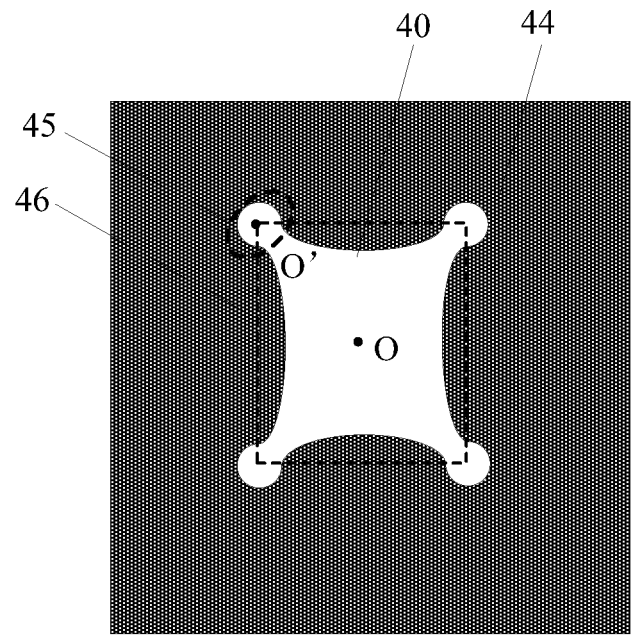
FIG. 8A is a structural schematic diagram of a quadrilateral black matrix opening with corners protruding outwards and edges dented inwards provided in an embodiment of the present disclosure.
Figure 8B:
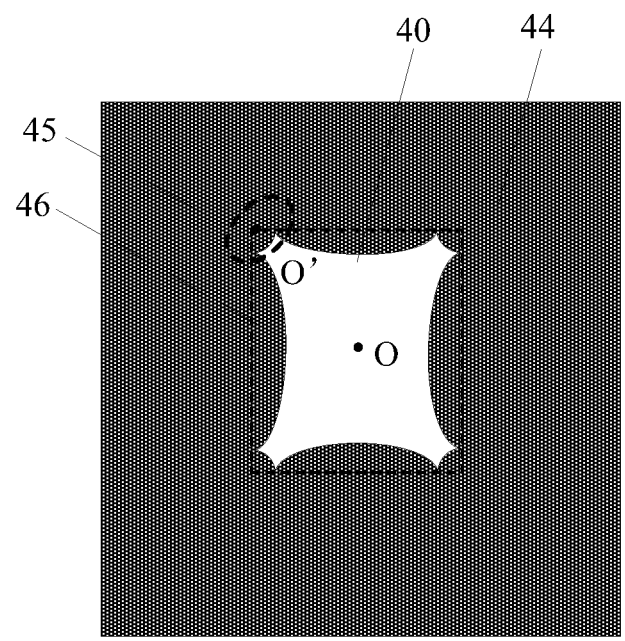
FIG. 8B is a structural schematic diagram of a quadrilateral black matrix opening with corners dented inwards and edges dented inwards provided in an embodiment of the present disclosure.
Figure 9A:
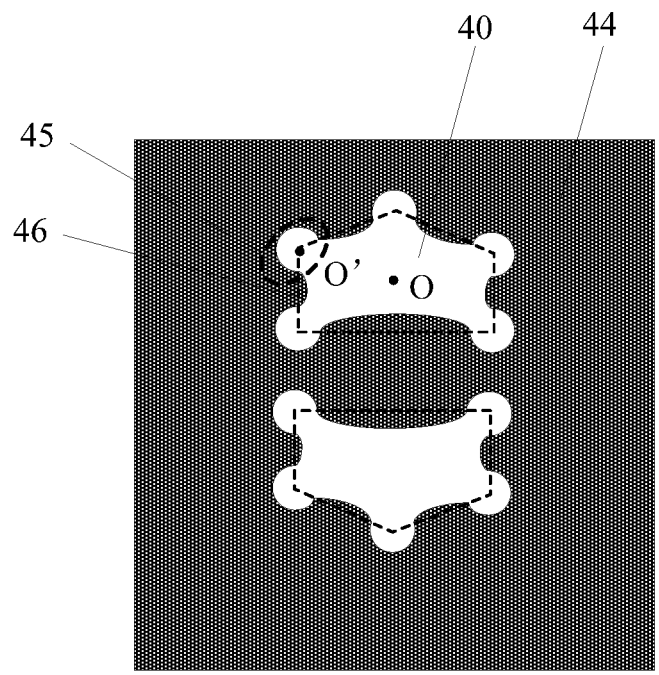
FIG. 9A is a structural schematic diagram of a pentagonal black matrix opening with corners protruding outwards and edges dented inwards provided in an embodiment of the present disclosure.
Figure 9B:
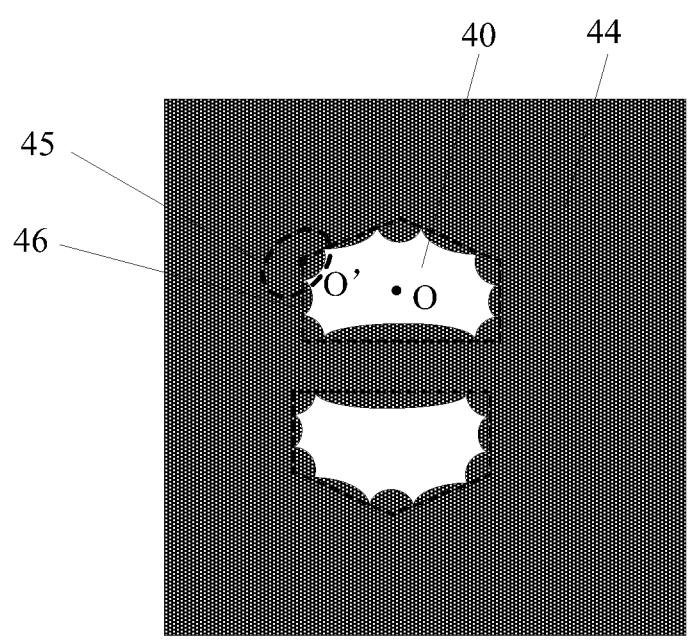
FIG. 9B is a structural schematic diagram of a pentagonal black matrix opening with corners dented inwards and edges dented inwards provided in an embodiment of the present disclosure.

During specific implementation, portions, except for the corners 45, of the edges 46 of the black matrix openings 40 are arc segments dented towards one sides close to the centers O of the black matrix openings 40, that is, the edges 46 are arc segments dented inwards. For example, as shown in FIG. 7A, a body shape of a black matrix openings 40 is the hexagon with circular arcs protruding outwards at corners 45 and arc segments dented inwards as edges 46; and as shown in FIG. 7B, a body shape of a black matrix opening 40 is the hexagons with circular arcs dented inwards at corners 45 and arc segments dented inwards as edges 46. For example, as shown in FIG. 8A, a body shape of a black matrix opening 40 is the quadrilateral with circular arcs protruding outwards at corners 45 and arc segments dented inwards as edges 46; and as shown in FIG. 8B, a body shape of a black matrix opening 40 is the quadrilateral with circular arcs dented inwards at corners 45 and arc segments dented inwards as edges 46. For example, as shown in FIG. 9A, a body shape of a black matrix opening 40 is the pentagon with circular arcs protruding outwards at corners 45 and arc segments dented inwards as edges 46; and as shown in FIG. 9B, a body shape of a black matrix opening 40 is the pentagon with circular arcs dented inwards at corners 45 and arc segments dented inwards as edges 46.

During specific implementation, the circular arcs at the corners 45 are directly connected to the arc segments of the edges 46. For example, as shown in 7B, the body shape of the black matrix opening 40 is the hexagons with circular arcs dented inwards at corners 45 and arc segments dented inwards as edges 46, and the arc segments at the edges 46 are directly connected to the circular arcs at the corners 45. For example, as shown in 8B, the body shape of the black matrix opening 40 is the quadrilateral with circular arcs dented inwards at corners 45 and arc segments dented inwards as edges 46, and the arc segments at the edges 46 are directly connected to the circular arcs at the corners 45.

It should be noted that FIG. 1B is only a schematic illustration showing that the body shapes of all the black matrix openings are hexagons, the corners 45 are all the arcs protruding outwards, and the edges 46 are all linear. The present disclosure is not limited thereto. During specific implementation, the body shapes of the black matrix openings 40 at different positions may be different, and shapes of the corners 45 and shapes of the edges of the black matrix openings 40 at different positions may be any combination of FIGS. 2A-2C, FIGS. 3A-3C, FIGS. 4A-4B, FIGS. 5A-5B, FIGS. 6A-6B, FIGS. 7A-7B, FIGS. 8A-8B, and FIGS. 9A-9B. In addition, in the embodiments of the present disclosure, the circular arcs at the corners may be other circular arcs not with the corner points as the circle centers, that is, the circle centers may not be located at the corner points, and the present disclosure is not limited thereto.

During specific implementation, as shown in FIG. 1B, orthographic projections of the black matrix openings 40 on the base substrate 1 cover orthographic projections of the light emitting portions 20 on the base substrate 1. That is, the black matrix openings 40 are required to be larger than the light emitting portions 20, thereby preventing the black matrix body 22 from affecting light emitting conditions of the light emitting portions 20. It may be understood that in the present disclosure, the orthographic projections of the black matrix openings 40 on the base substrate 1 cover the orthographic projections of the light emitting portions 20 on the base substrate 1, with the corners 45 of the black matrix openings 40 designed as the circular arcs protruding outwards or dented inwards, and the edges 46 designed as the arc segments protruding outwards or dented inwards, that is, after the black matrix openings 40 in the embodiments of the present disclosure are improved, the orthographic projections of the black matrix openings on the base substrate 1, still cover the orthographic projections of the light emitting portions 20 on the base substrate 1.

Figure 10A:
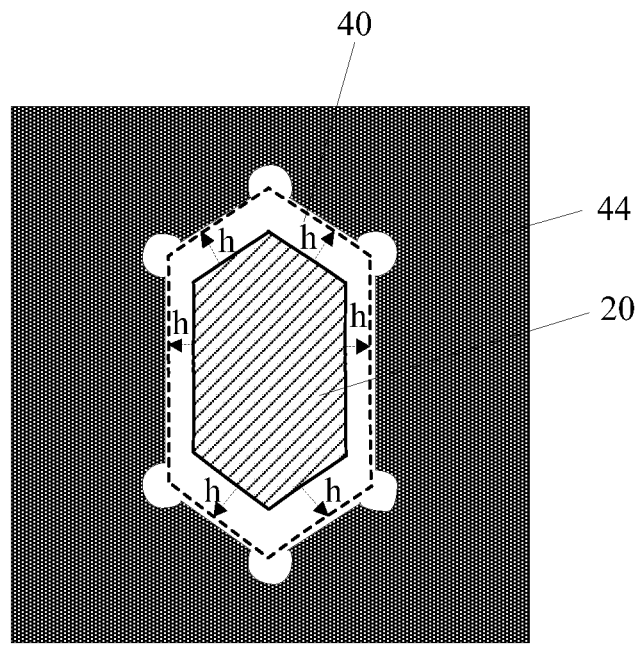
FIG. 10A is a schematic diagram of a hexagonal black matrix opening covering a light emitting portion provided in an embodiment of the present disclosure.
Figure 10B:
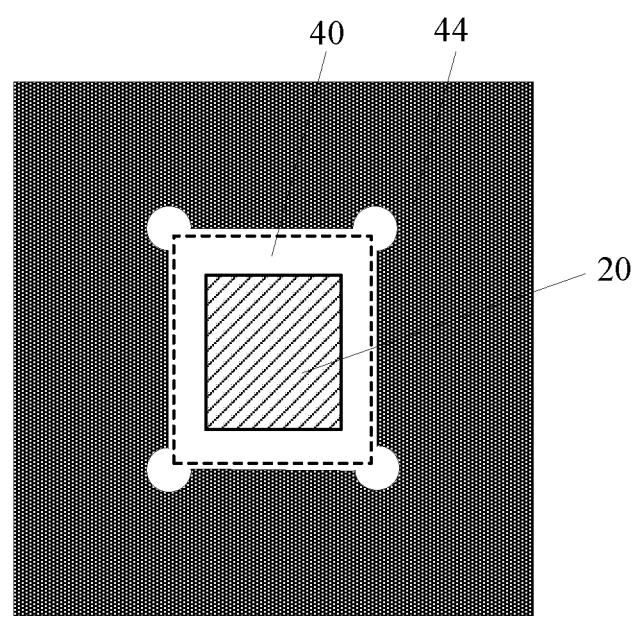
FIG. 10B is a schematic diagram of a quadrilateral black matrix opening covering a light emitting portion provided in an embodiment of the present disclosure.
Figure 10C:
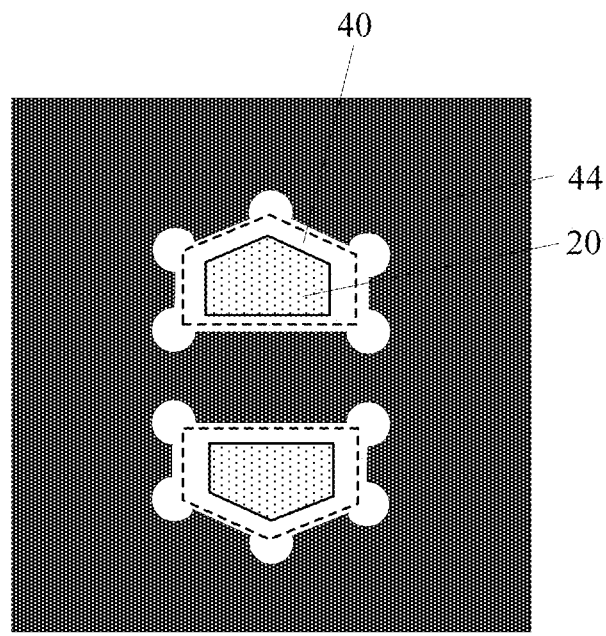
FIG. 10C is a schematic diagram of a pentagonal black matrix opening covering a light emitting portion provided in an embodiment of the present disclosure.

During specific implementation, the shapes of the light emitting portions 20 are similar with the body shapes of the black matrix openings 40. For example, as shown in FIG. 10A, a body shape of a black matrix opening 40 is the hexagon, and a shape of a corresponding light emitting portion 20 is also the hexagon. For example, as shown in FIG. 10B, a body shape of a black matrix opening is the quadrilateral, and a shape of a corresponding light emitting portion 20 is also the quadrilateral. For example, as shown in FIG. 10C, a body shape of a black matrix opening 40 is the pentagon, and a shape of a corresponding light emitting portion 20 is also the pentagon.

During specific implementation, centers of the black matrix openings 40 overlap centers of the light emitting portions 20. Certainly, it may be understood that during actual manufacturing, due to limitation of the process accuracy, it is difficult to make the centers of the black matrix openings 40 completely and accurately overlap the centers of the light emitting portions 20. Therefore, in the embodiments of the present disclosure, overlapping between the centers of the black matrix openings 40 and the centers of the light emitting portions 20 may be interpreted as approximate overlapping therebetween.

During specific implementation, the shapes of the light emitting portions 20 are expanded outwards by 2 micrometers-6 micrometers to obtain the body shapes of the black matrix openings 40. For example, as shown in FIG. 10A, the body shape of the black matrix opening 40 is the hexagons, and the shape of the corresponding light emitting portion 20 is also the hexagon, such that the black matrix opening and the light emitting portion are similar in shape and overlap in centers. The body shape of the black matrix opening 40 is obtained, based on the shape of the light emitting portion 20, by shifting various boundaries of the light emitting portion 20 outwards by a distance h in directions perpendicular to the boundaries (as shown by dotted arrows in FIG. 10A), where specifically, h may range from 2 micrometers to 6 micrometers.

Figure 11A:
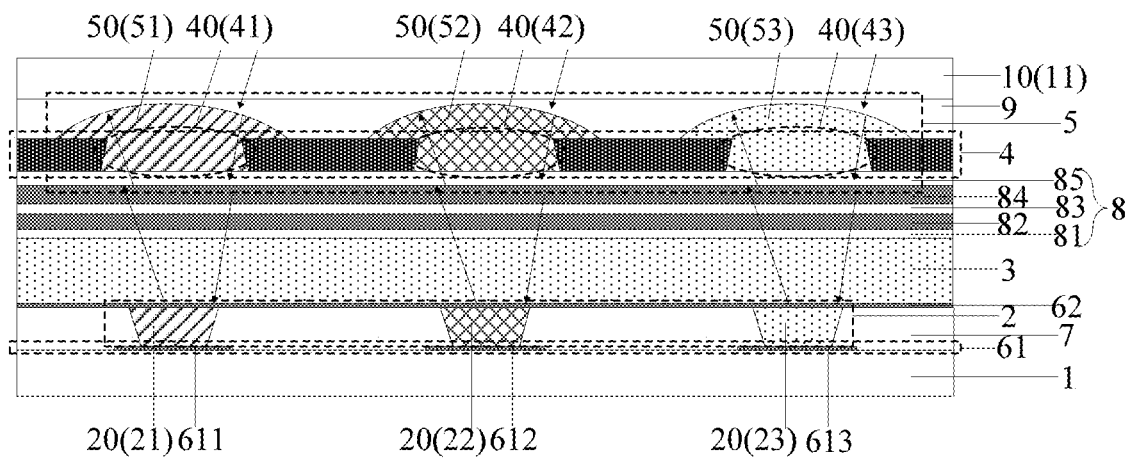
FIG. 11A is a specific structural schematic diagram of a display panel provided in an embodiment of the present disclosure.
Figure 11B:
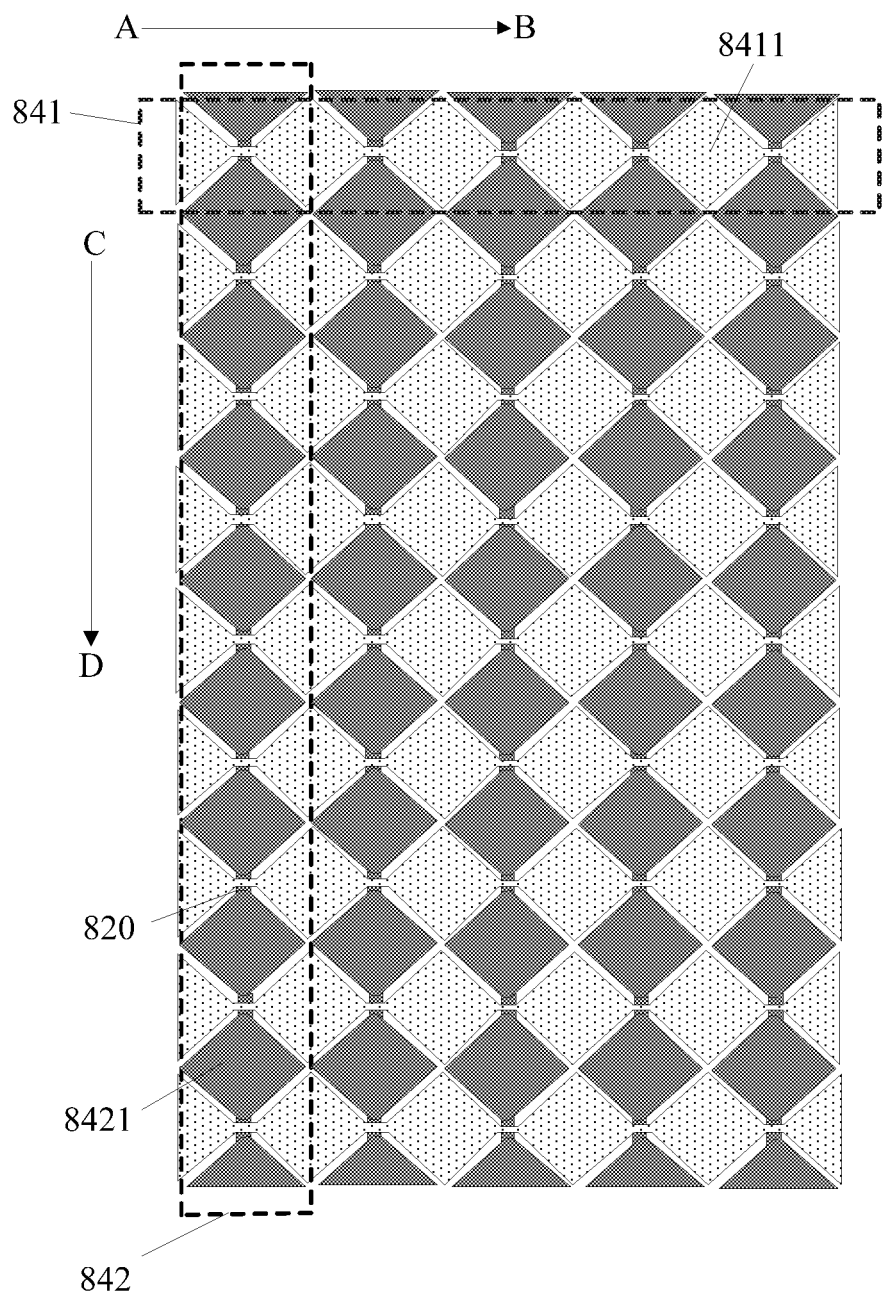
FIG. 11B is a top-view schematic diagram of a second metal layer provided in an embodiment of the present disclosure.

During specific implementation, as shown in FIGS. 11A and 11B, a touch layer 8 is provided between the encapsulation layer 3 and the black matrix layer 4. The touch layer 8 includes a first insulation layer 81, a first metal layer 82, a second insulation layer 83, a second metal layer 84, and a third insulation layer 85 positioned at one side of the encapsulation layer 3 in sequence. The second metal layer 84 includes a plurality of first touch electrodes 841 extending in a first direction AB, and a plurality of second touch electrodes 842 extending in a second direction CD. The first touch electrodes 841 and the second touch electrodes 842 are insulated alternately. Each of the first touch electrodes 841 includes a plurality of first touch sub-electrode blocks 8411 connected to one another, and each of the second touch electrodes 842 includes a plurality of second touch sub-electrode blocks 8421 spaced from one another. The first metal layer 82 includes a plurality of bridging electrodes 820, and the second touch sub-electrode blocks 8421 in the same second direction CD are electrically connected through the bridging electrodes 820.

Figure 12:
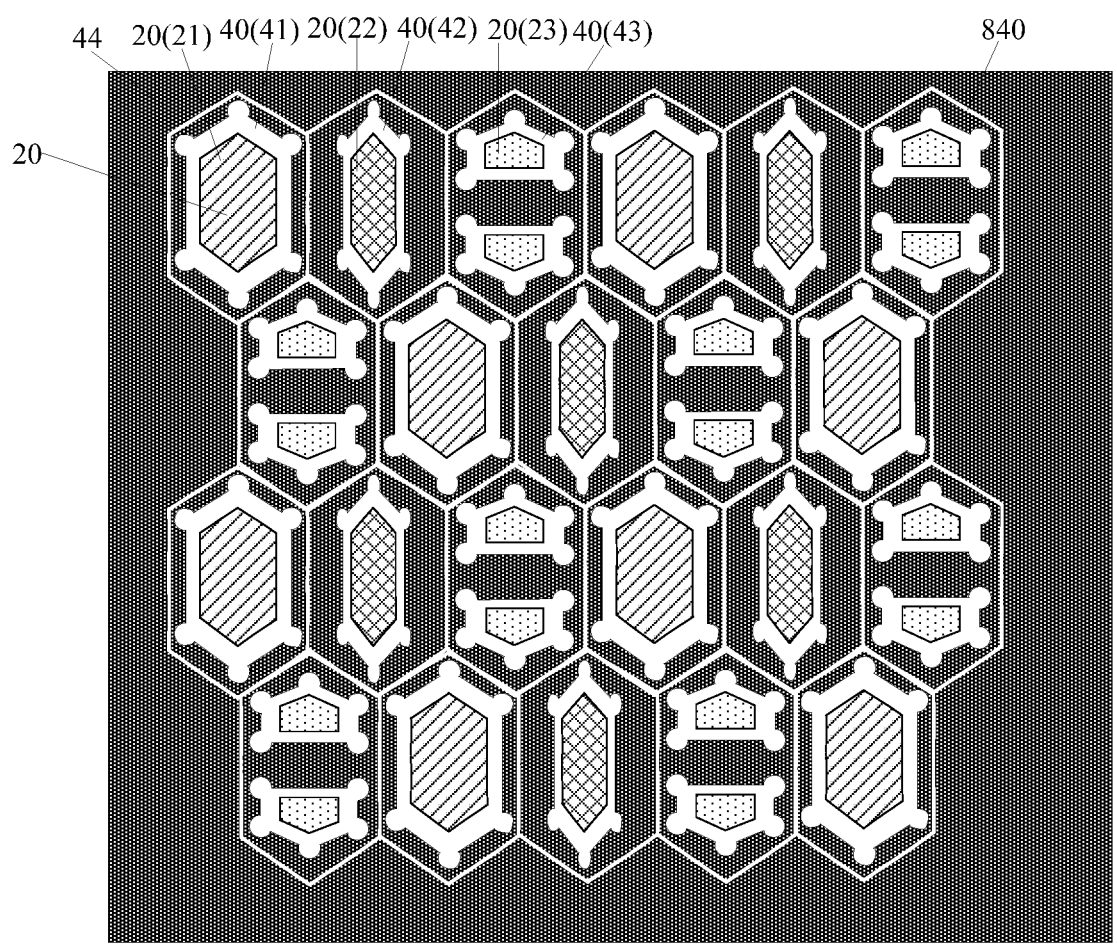
FIG. 12 is a schematic diagram of a second metal layer with meshes provided in an embodiment of the present disclosure.

During specific implementation, as shown in FIG. 12, the first touch sub-electrode blocks 8411, the second touch sub-electrode blocks 8421, and the bridging electrodes 820 are all provided with meshes (for example, hexagons enclosed by white lines in FIG. 12), orthographic projections of the meshes on the base substrate 1 cover orthographic projections of the light emitting portions 20 on the base substrate 1. That is, specifically, the first touch sub-electrode blocks 8411, the second touch sub-electrode blocks 8421, and the bridging electrodes 820 may be of structures with a plurality of meshes formed by metal lines 840. It may be understood that since higher pixel accuracy is required relative to touch accuracy, areas of the first touch sub-electrodes blocks 8411 and the second touch sub-electrode blocks 8421 are far larger than areas of the light emitting portions 20. Therefore, FIG. 12 shows corresponding relations between enlarged first touch sub-electrode blocks 8411, enlarged second touch sub-electrode blocks 8421, as well as enlarged bridging electrodes 820, and the light emitting portions 20, that is, FIG. 11B is an overall schematic diagram of the first touch sub-electrode blocks 8411, the second touch sub-electrode blocks 8421, and the bridging electrodes 820, and FIG. 12 shows the corresponding relations between the enlarged first touch sub-electrode blocks, the enlarged second touch sub-electrode blocks, as well as the enlarged bridging electrodes, and the light emitting portions 20. First touch sub-electrode blocks 8411 and second touch sub-electrode blocks 8421 in the same layer are spaced from one another, which may be specifically formed by breaking the metal lines 840 at corresponding positions.

During specific implementation, as shown in FIG. 12, an orthographic projection, on the base substrate 1, of the region, except for the black matrix openings 40, of the black matrix layer 4 (that is, the black matrix body 44) covers regions, except for the meshes, of the first touch sub-electrode blocks 8411 (that is, regions of the metal lines 840), regions, except for the meshes, of the second touch sub-electrode blocks 8421 (that is, regions of the metal lines 840), and regions, except for the meshes, of the bridging electrodes 820 (that is, regions of the metal lines 840).

During specific implementation, as shown in FIG. 11A, one side, away from the black matrix layer 4, of the color filter layer 5 is provided with a protective layer 9. Specifically, the protective layer 9 may be an optical adhesive layer, to protect the color resist portions 50 of the color filter layer 5 and the black matrix layer 4. An anode layer 61 may be further arranged between the pixel definition layer 7 and the base substrate 1. Specifically, the anode layer 61 may include first-type anodes 611 corresponding to the first-type light emitting portions 21, second-type anodes 612 corresponding to the second-type light emitting portions 22, and third-type anodes 613 corresponding to the third-type light emitting portions 23. A cathode layer 62 may be further arranged between the light emitting layer 2 and the encapsulation layer 3. Specifically, the cathode layer 62 may be of a structure in an entire layer. A driving layer (not shown in the figure) may be further arranged between the anode layer 61 and the base substrate 1. Specifically, the driving layer may be provided with a pixel driving circuit for driving the display panel for display, and the pixel driving circuit may include a plurality of transistors and a plurality of capacitors.

During specific implementation, one side, away from the color filter layer 5, of the protective layer 9 is provided with a cover plate 10 or a covering filter layer 11. Specifically, the cover plate 10 may be a glass cover plate.

A method for manufacturing the display panel provided in the embodiments of the present disclosure may specifically include the following operations.

Operation 1, a mask plate corresponding to patterns of black matrix openings in the embodiments of the present disclosure is provided.

Operation 2, an anode layer, a pixel definition layer, a light emitting layer, a cathode layer, an encapsulation layer, and a touch layer are formed at one side of a base substrate in sequence.

Operation 3, one side, away from the encapsulation layer, of the touch layer is coated with a light shielding thin membrane, that is, a basement membrane (BM).

Operation 4, the light shading thin membrane is exposed, developed, and cleaned, to obtain a black matrix layer with the black matrix openings.

Operation 5, a patterned color filter layer is formed at one side, away from the touch layer, of the black matrix layer.

Figure 13A:
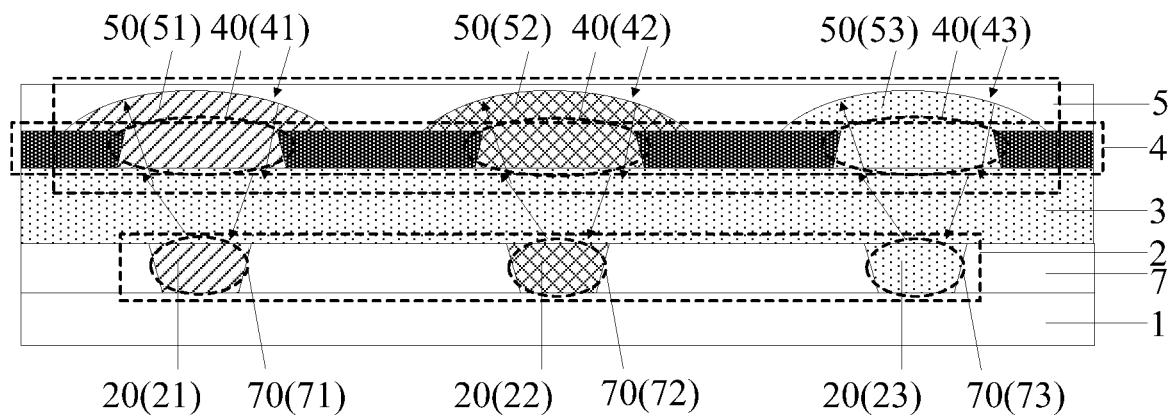
FIG. 13A is a specific structural schematic diagram of another display panel provided in an embodiment of the present disclosure.
Figure 13B:
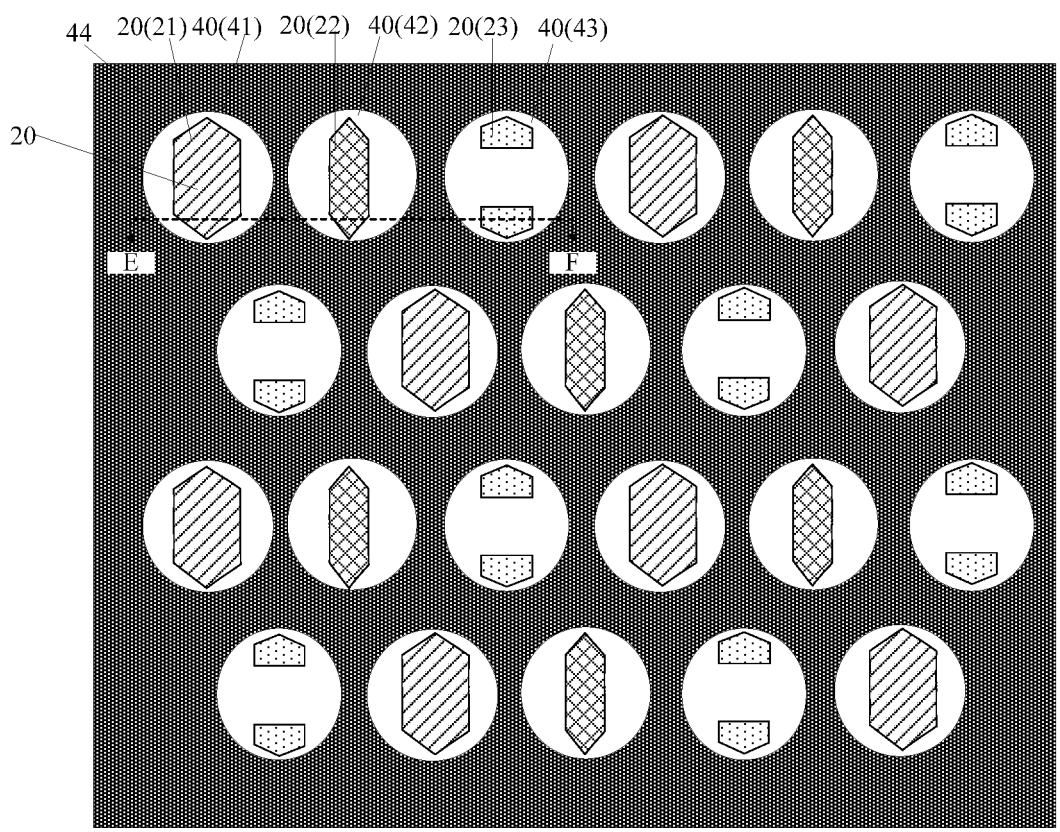
FIG. 13B is a top-view structural schematic diagram of another display panel provided in the embodiment of the present disclosure.
Figure 13C:
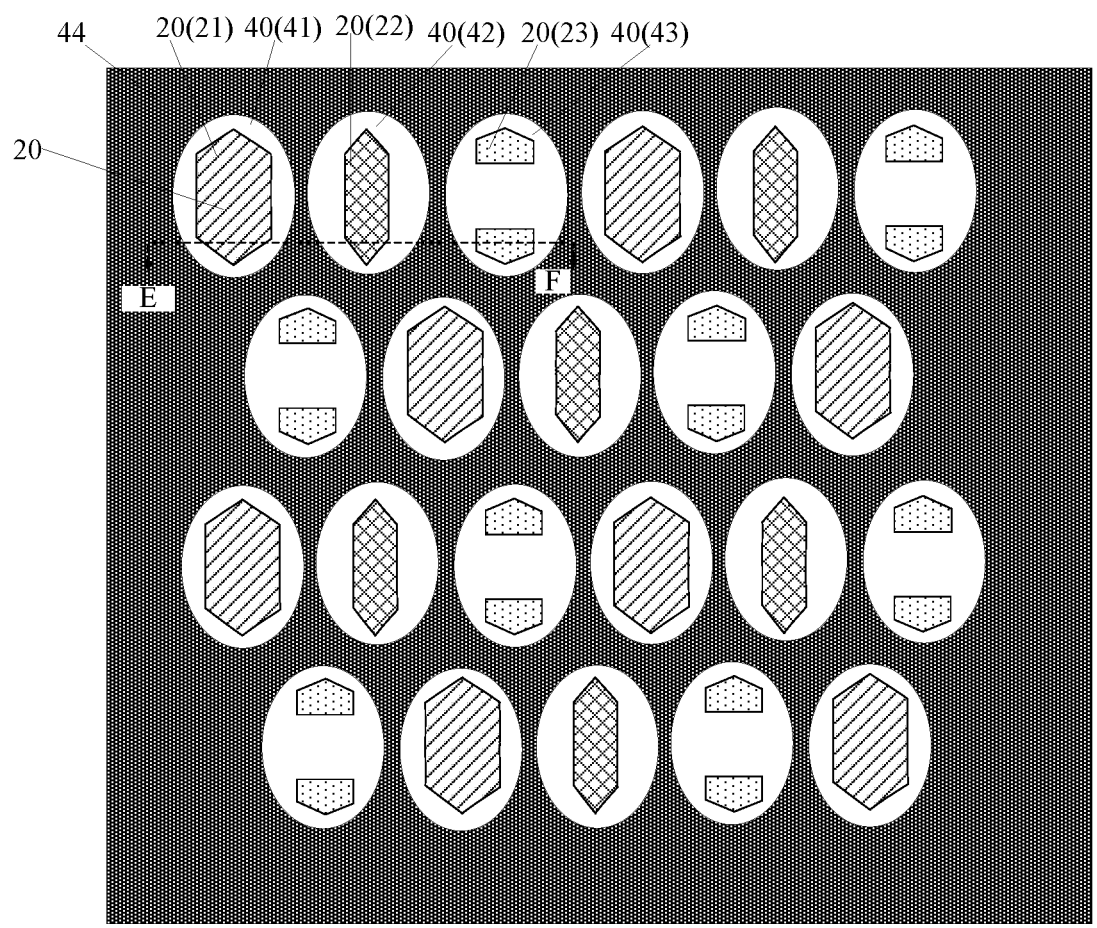
FIG. 13C is another top-view structural schematic diagram of another display panel provided in the embodiment of the present disclosure.

Based on the same inventive concept, an embodiment of the present disclosure further provides a display panel. With reference to FIGS. 13A-13C, the display panel includes a base substrate 1, a pixel definition layer 7, a light emitting layer 2, an encapsulation layer 3, a black matrix layer 4 and a color filter layer 5.

The pixel definition layer 7 is arranged at one side of the base substrate 1 and provided with a plurality of pixel definition openings 70.

The light emitting layer 2 is arranged at one side, away from the base substrate 1, of the pixel definition layer 7 and provided with a plurality of light emitting portions 20, and the light emitting portions 20 being positioned in the pixel definition openings 70.

The encapsulation layer 3 is arranged at one side, away from the pixel definition layer 7, of the light emitting layer 2.

The black matrix layer 4 is arranged at one side, away from the light emitting layer 2, of the encapsulation layer 3 and provided with black matrix openings 40 in regions corresponding to the light emitting portions 20, shapes of the black matrix openings 40 being circular (as shown in 13B) or elliptical (as shown in 13C), and orthographic projections, on the base substrate 1, of the black matrix openings 40 covering orthographic projections, on the base substrate 1, of the pixel definition openings 70.

The color filter layer 5 is arranged at one side, away from the encapsulation layer 3, of the black matrix layer 4 and provided with color resist portions 50 in regions corresponding to the black matrix openings 40.

During specific implementation, as shown in FIGS. 13B and 13C, centers of the black matrix openings 40 overlap centers of the light emitting portions 20.

In an embodiment of the present disclosure, body shapes of the black matrix openings are circles or ellipses, and the orthographic projections, on the base substrate, of the black matrix openings cover the orthographic projections, on the base substrate, of the pixel definition openings. Compared with a conventional display panel in which black matrix openings close up sharply at corners, the body shapes of the black matrix openings in the embodiment of the present disclosure are circles or ellipses, thereby smoothing size mutations at the sharp corners and weakening a diffraction effect of reflected light generated after external ambient light passes through the display panel, to weaken a color separation phenomenon.

Based on the same inventive concept, an embodiment of the present disclosure further provides a display apparatus, including the display panel provided in the embodiments of the present disclosure; or the display panel further provided in the embodiments of the present disclosure.

The embodiments of the present disclosure have the beneficial effects as follows: in the embodiments of the present disclosure, the body shapes of the black matrix openings are the polygons, and the black matrix openings are the cambered curves at least at the corners of the polygons, to realize the cambered transitional connections between the edges of the polygons. Compared with the conventional display panel in which the black matrix openings close up sharply at the corners, the black matrix openings in the embodiment of the present disclosure are provided with the cambered corners, thereby smoothing the size mutations at the sharp corners and weakening a diffraction effect of reflected light generated after external ambient light passes through the display panel, to weaken a color separation phenomenon.

Obviously, a person skilled in the art may make various amendments and variations to the present disclosure without departing from the spirit and scope of the present disclosure. In this way, it is intended that the present disclosure also includes these amendments and variations if the amendments and variations to the present disclosure fall within the scope of claims of the present disclosure and the equivalents thereof.

What is claimed is:

1. A display panel, comprising:
   a base substrate;
   a light emitting layer, arranged at one side of the base substrate and provided with a plurality of light emitting portions;
   an encapsulation layer, arranged at one side, away from the base substrate, of the light emitting layer;
   a black matrix layer, arranged at one side, away from the light emitting layer, of the encapsulation layer and provided with a plurality of black matrix openings in regions corresponding to the plurality of light emitting portions, wherein body shapes of the black matrix openings are polygons and have cambered curves at least at corners of the polygons, to realize transitional connections among edges of the polygons, wherein the transitional connections are configured to reduce a diffraction effect of ambient light at the black matrix openings; and
   a color filter layer, arranged at one side, away from the encapsulation layer, of the black matrix layer and provided with a plurality of color resist portions in regions corresponding to the black matrix openings;
   wherein edges of the black matrix openings, except for the corners, are linear.

2. The display panel according to claim 1, wherein the corners of the black matrix openings are circular arcs protruding towards sides, away from centers of the black matrix openings.

3. The display panel according to claim 2, wherein the corners of the black matrix openings are the circular arcs with corner points as circle centers, and the corner points are intersection points between extension lines of adjacent edges.

4. The display panel according to claim 1, wherein the corners of the black matrix openings are circular arcs dented towards sides, close to centers of the black matrix openings.

5. The display panel according to claim 4, wherein the corners of the black matrix openings are the circular arcs with corner points as circle centers, and the corner points are intersection points between extension lines of adjacent edges.

6. The display panel according to claim 3, wherein the body shapes of the black matrix openings are quadrilaterals, pentagons, or hexagons; and
   radii of the circular arcs are one fifth to three fifths of lengths of shortest edges of the black matrix openings.

7. The display panel according to claim 2, wherein
   portions, except for the corners, of the edges of the black matrix openings are arc segments protruding towards the sides, away from the centers of the black matrix openings;
   portions, except for the corners, of the edges of the black matrix openings are arc segments dented towards the sides, close to the centers of the black matrix openings, and the circular arcs at the corners are directly connected to the arc segments of the edges.

8. The display panel according to claim 1, wherein orthographic projections, on the base substrate, of the black matrix openings cover orthographic projections, on the base substrate, of the light emitting portions.

9. The display panel according to claim 7, wherein shapes of the light emitting portions are similar with the body shapes of the black matrix openings.

10. The display panel according to claim 9, wherein the centers of the black matrix openings overlap centers of the light emitting portions.

11. The display panel according to claim 9, wherein a pixel definition layer is arranged between the base substrate and the light emitting layer, the pixel definition layer is provided with a plurality of pixel definition openings, the light emitting portions are arranged in the pixel definition openings, and the shapes of the light emitting portions are consistent with shapes of the pixel definition openings.

12. The display panel according to claim 9, wherein the shapes of the light emitting portions are expanded outwards by 2 micrometers-6 micrometers, to obtain the body shapes of the black matrix openings.

13. The display panel according to claim 1, wherein a portion, except for the black matrix openings, of the black matrix layer is a black matrix body, and orthographic projections, on the base substrate, of the color resist portions cover a part of the black matrix body on peripheries of the black matrix openings.

14. The display panel according to claim 1, wherein a touch layer is arranged between the encapsulation layer and the black matrix layer;
   the touch layer comprises a first insulation layer, a first metal layer, a second insulation layer, a second metal layer, and a third insulation layer which are arranged at one side of the encapsulation layer in sequence;
   the second metal layer comprises a plurality of first touch electrodes extending in a first direction and a plurality of second touch electrodes extending in a second direction, the first touch electrodes and the second touch electrodes are insulated alternately, each of the first touch electrodes comprises a plurality of first touch sub-electrode blocks which are connected to one another, and each of the second touch electrodes comprises a plurality of second touch sub-electrode blocks which are spaced from one another; and the first metal layer comprises a plurality of bridging electrodes, and the second touch sub-electrode blocks in the same second direction are electrically connected through the bridging electrodes.

15. The display panel according to claim 14, wherein the first touch sub-electrode blocks, the second touch sub-electrode blocks, and the bridging electrodes are provided with meshes, orthographic projections, on the base substrate, of the meshes cover the orthographic projections, on the base substrate, of the light emitting portions; and an orthographic projection, on the base substrate, of a region, except for the black matrix openings, of the black matrix layer covers a region, except for the meshes, of the first touch sub-electrode blocks, a region, except for the meshes, of the second touch sub-electrode blocks, and a region, except for the meshes, of the bridging electrodes.

16. The display panel according to claim 14, wherein one side, away from the black matrix layer, of the color filter layer is provided with a protective layer; and one side, away from the color filter layer, of the protective layer is provided with a cover plate or a covering filter layer.

17. A display apparatus, comprising a display panel, wherein the display panel comprises:

a base substrate;

a light emitting layer, arranged at one side of the base substrate and provided with a plurality of light emitting portions;

an encapsulation layer, arranged at one side, away from the base substrate, of the light emitting layer;

a black matrix layer, arranged at one side, away from the light emitting layer, of the encapsulation layer and provided with a plurality of black matrix openings in regions corresponding to the plurality of light emitting portions, wherein body shapes of the black matrix openings are polygons and have cambered curves at least at corners of the polygons, to realize transitional connections among edges of the polygons, wherein the transitional connections are configured to reduce a diffraction effect of ambient light at the black matrix openings; and a color filter layer, arranged at one side, away from the encapsulation layer, of the black matrix layer and provided with a plurality of color resist portions in regions corresponding to the black matrix openings;

wherein edges of the black matrix openings, except for the corners, are linear.

* * * * *